United States Patent [19]
Yang et al.

[11] Patent Number: 6,062,442
[45] Date of Patent: May 16, 2000

[54] DISPENSE SYSTEM OF A PHOTORESIST COATING MACHINE

[75] Inventors: Ming-Che Yang, Kaohsiung; Kuo-Feng Huang, Hsinchu Hsien; Eric Liu; En-Tien Tan, both of Hsinchu, all of Taiwan

[73] Assignee: United Microelectronics Corp., Hsinchu, Taiwan

[21] Appl. No.: 09/185,778

[22] Filed: Nov. 3, 1998

[51] Int. Cl.[7] .................................................. B65D 5/72
[52] U.S. Cl. ............................ 222/571; 118/52; 118/56; 118/319; 118/320
[58] Field of Search ........................ 222/63, 189.11, 222/571; 239/119, 106; 118/52, 56, 319, 320, 683, 684

[56] References Cited

U.S. PATENT DOCUMENTS

| | | | |
|---|---|---|---|
| 2,779,506 | 1/1957 | Gajda | 222/571 |
| 3,887,110 | 6/1975 | Porter | 222/63 |
| 3,895,748 | 7/1975 | Klingenberg | 222/571 |
| 4,597,719 | 7/1986 | Tano | 222/571 X |
| 4,863,066 | 9/1989 | Uffenheimer et al. | 222/571 X |
| 4,942,984 | 7/1990 | Miller | 222/571 X |
| 5,134,962 | 8/1992 | Amada et al. | 222/63 X |
| 5,255,892 | 10/1993 | McCormick | 222/571 X |
| 5,890,623 | 4/1999 | Thomas | 222/63 X |
| 5,950,923 | 9/1999 | Fukano et al. | 222/571 X |
| 5,950,924 | 9/1999 | Hatakeyama et al. | 222/571 X |

*Primary Examiner*—Joseph A. Kaufman
*Assistant Examiner*—Thach Bui

[57] ABSTRACT

A photoresist dispensing system used in a photoresist coating machine includes a pump, a sucking-back valve, a solenoid valve, a first pump speed controller, a second pump speed controller and a sucking-back speed controller. The pump is used to transport photoresist and spray a substrate. The sucking-back valve is used to suck back liquid photoresist from a transporting duct end. The solenoid is used to activate or inactivate the pump and the sucking-back valve. The first and the second pump speed controllers are separately coupled between the pump and the solenoid valve, and the sucking-back speed controller is coupled between the sucking-back valve and the sucking-back speed controller is coupled between the sucking-back valve and the route, where is between the pump and the second pump speed controller. Hence, the sucking-back valve produces a sucking force after the pump is inactivated and releases a sucking force after pump is activated.

20 Claims, 3 Drawing Sheets

DISPENSE SYSTEM OF A PHOTORESIST COATING MACHINE

BACKGROUND OF THE INVENTION

1. Field of the Invention

This invention relates to a photoresist coating machine, and more particularly to a dispensing system used in a photoresist coating machine.

2. Description of Related Art

Photolithography plays an essential role in semiconductor fabrication. All semiconductor devices need several photolithography process to transfer desired patterns so as to form the devices as designed. A semiconductor device usually includes, for example, a transistor structure with proper doping regions, a capacitor, and an interconnecting structure for connection between each component. All these needs several different photolithography processes. A more complex structure accordingly needs more photolithography processes.

The detailed photolithography technology is usually complicated but its theory is straightforwardly simple. Generally, a photoresist layer is coated on a device substrate surface, on which a device is fabricated. The photoresist layer then is exposed by a light source through a photomask, which carries a pattern to be transferred onto the device substrate surface. The photoresist layer includes photo-sensitive material that can be exposed to light to selectively change its material property. After development, the remaining photoresist layer on the device substrate surface forms the desired pattern. The desired pattern therefore is transferred to the device substrate. Up to this stage, the photolithography process is done. A subsequent process, such as etching or doping, are performed to form one sub-structure of the device, which usually includes several different sub-structures. So, a more complex structure accordingly needs more photolithography processes.

Currently, the photoresist layer can be formed by a spin coating process so as to obtain its thickness uniformity and adhesion without defects. FIG. 1 is a side view of a conventional spinner used for spin coating. A substrate 12 is held by a spinner 10. The spinner 10 fixes the substrate 12 by sucking it with a vacuum force, which is created through a rotating axle of the spinner 10. As the substrate 10 is rotated by the spinner 12, a liquid photoresist 14 sprayed on the substrate 12 is outwardly distributed due to centrifugal force. The liquid photoresist 14 contains volatile organic solution. After volatilization, a uniform photoresist layer 16 with strong adhesion is formed over the substrate 10.

FIG. 2 is a schematic drawing of a conventional photoresist dispensing system included in a photoresist coating machine. In FIG. 2, the photoresist coating machine is, for example, a DNS 636 photoresist coating machine. The conventional dispensing system includes a photoresist cabinet 20 to contain a liquid photoresist 22, which are transported through, for example, a duct 90. A pump 24 is operated to pump out the liquid photoresist 22, which is then transported to a filter 26 and a check valve 28 on the duct 90. The purpose of the check valve 28 is to prevent the liquid photoresist 22 from flowing back. The liquid photoresist 22 passing through a sucking-back valve 30 then is transported to a duct end 46 and is sprayed onto a substrate 34 held by a spinner 32. The sucking-back valve 30 is used to allow the liquid photoresist 22 to be sucked back a little from the duct end 46 when the photoresist coating process completes so that undesired extra liquid photoresist is prevented from dropping on the substrate 34, causing a deterioration of a photoresist layer (not shown) formed on the substrate 34.

The pump 24 and the sucking-back valve 30 are controlled by a solenoid valve 36, which switches operation modes between a dispensing mode and a stopping mode. In the dispensing mode, the liquid photoresist 22 is transported to the duct end 46 to spray the substrate 34. In stopping mode, the liquid photoresist 22 is not dispensed and on the contrary is sucked back a little to prevent undesired photoresist from dropping out onto the substrate 34. The solenoid valve 36 uses an exhaust end EXH and an air-injection end AIR to create an air flow to achieve the purpose of control. The single line route 91 between each components represents an air flow route.

The air-injection end (AIR) is coupled to the pump 24 through an air-flow speed controller SC3. The exhaust end (EXH) is coupled to the sucking-back valve 30 through two air-flow speed controllers SC1, SC2, which are serially coupled. A air-flow speed controller SC4 is coupled between the solenoid valve 36 and the pump 24. The air-flow speed controllers SC1, SC2, SC3, SC4, and SC4 include a regulating valve 38 and an one-way valve 40 shown in speed controller SC2.

When photoresist coating completes, the solenoid valve 36 through a combining actions of the AIR and the EXH on the gas-flow speed controllers SC3, SC4 induces a move of a cylinder 42 inside the pump 24 to stop pumping of the pump 24. Simultaneously, a diaphragm 44 inside the sucking-back valve 30 is pulled back (to the right in FIG. 2). Ideally, the pump 24 stops first so that the liquid photoresist 22 stop supplying. Then, the sucking-back valve 30 produces a sucking-back force to pull the liquid photoresist 22 a little back from the duct end 46 so as to prevent a little undesired liquid photoresist, such as one or two drops, from dropping on the formed photoresist layer (not shown) on the substrate 34.

In practical operation, it is difficult to control the sequential order of actions of stopping the pump 24 and producing sucking-back force from the sucking-back valve 30. If the sucking-back valve 30 is activated before the pump 24 is stopped, extra drops of the liquid photoresist 22 may drop onto the formed photoresist layer on the substrate 34. Moreover, during switching transition period of the solenoid valve 36 from stop to action, if the sucking-back valve 30 releases its sucking-back force before the pump 24 starts operation, extra drops of the liquid photoresist 22 may also drop onto the substrate 34 before photoresist coating operation starts. This also deteriorates the quality of the photoresist layer, which is to be formed.

In summaries, the conventional photoresist dispensing system used to coat a photoresist layer on a substrate has a problem to properly control the action time order of the pump 24 and the sucking-back valve 30. This may cause a few undesired drops of the liquid photoresist 22 to drop onto the substrate 34 and deteriorate the quality of a photoresist layer to be formed.

SUMMARY OF THE INVENTION

It is therefore an objective of the present invention to provide a photoresist dispensing system, which can prevent undesired liquid photoresist from dropping onto a substrate so that the quality of the formed photoresist layer is maintained.

In accordance with the foregoing and other objectives of the present invention, an improved photoresist dispensing system is provided. The improved photoresist dispensing system includes a pump, a sucking-back valve, a solenoid valve, a first pump speed controller, a second pump speed controller, and a sucking-back speed controller. The purpose of the pump is to pump liquid photoresist, which is a chemical solution, to transport it to a semiconductor substrate. The pump further includes a first input/output (I/O) end and a second I/O end for a purpose to control operations of the pump. The liquid photoresist passing the sucking-back valve is transported to a duct end of a transport duct and is sprayed onto the substrate, in which the liquid photoresist is transported along the transporting duct. The sucking-back valve includes a third I/O end to produce sucking-back force.

The solenoid valve including, for example, an air-in end and an air-out end serves as a switch to control the sucking-back valve and the pump. The first pump speed controller coupled between the first I/O end of the pump and the air-in end of the solenoid valve is used to control an action speed of the pump. The second pump speed controller coupled between the second I/O end of the pump and the air-out end of the solenoid valve is used to control an action speed of the pump. The sucking-back speed controller coupled between the third I/O end of the sucking-back valve and the second I/O end of the pump is used to delay the sucking action speed. While the solenoid valve triggers the pump through the first pump speed controller and the second pump speed controller the sucking-back valve is also triggered but with a delay time due to the sucking-back speed controller.

The sucking-back valve produces a sucking force after the pump is inactivated and releases a sucking force after pump is activated.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

The invention basically modifies the conventional couplings architecture between each control units so that a control function is created to prevent undesired liquid photoresist from deteriorating the quality of a photoresist layer.

Figure 3:
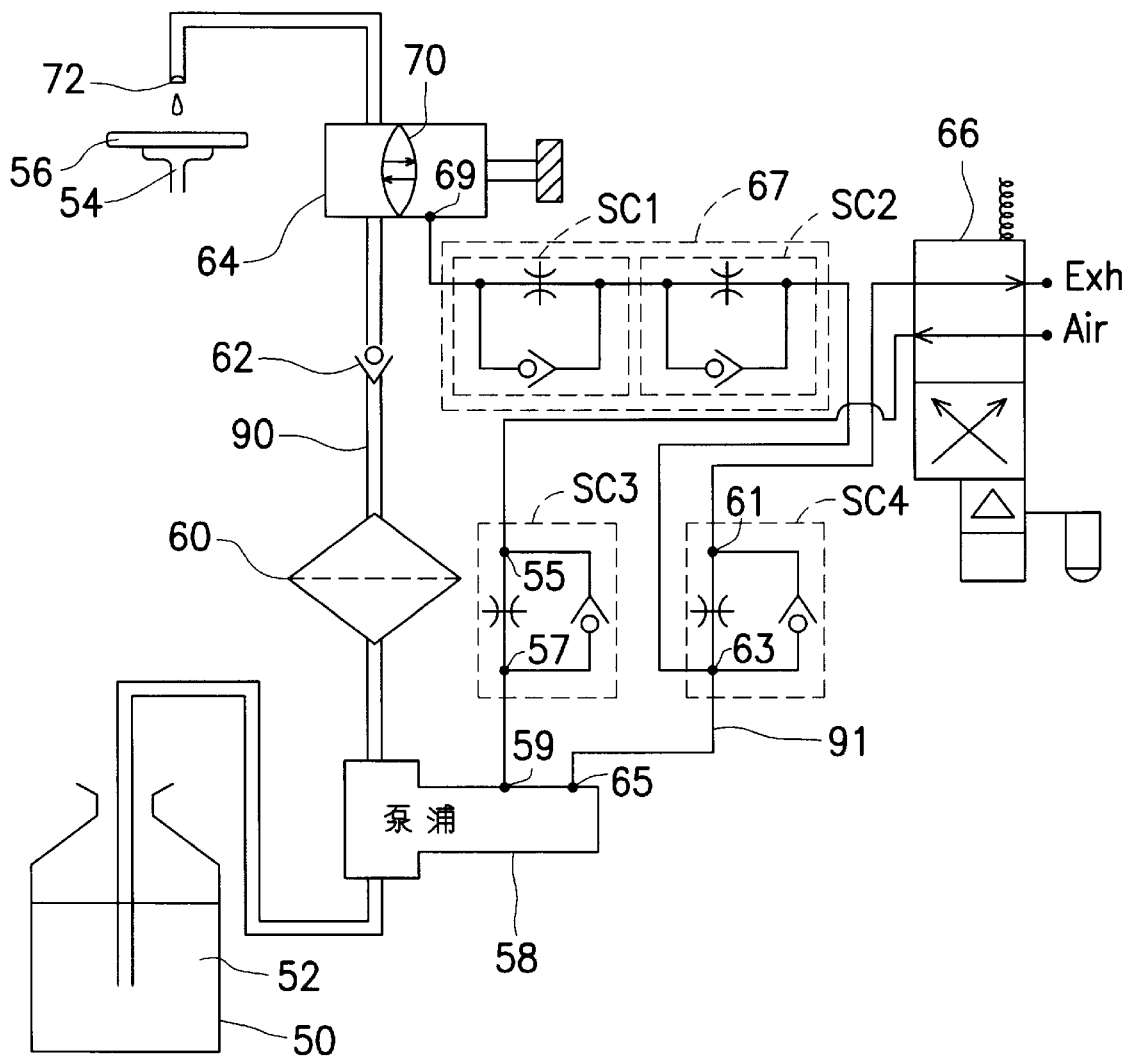
FIG. 3 is a schematic drawing of an improved photoresist dispensing system included in a photoresist coating machine according to a preferred embodiment of the invention.

FIG. 3 is a schematic drawing of an improved photoresist dispensing system included in a photoresist coating machine, according to a preferred embodiment of the invention. In FIG. 3, the photoresist coating machine is, for example, a DNS 636 photoresist coating machine. The improved dispensing system includes a photoresist cabinet 50 to contain a liquid photoresist 52, which are transported through, for example, duct shown in double-lines route 90 in FIG. 3. The liquid photoresist 52 is, for example, a kind of chemical solution, which includes, for example, photosensitive material. A pump 58 is used to pump out the liquid photoresist 52, which is then transported through the duct 90 to a filter 60 and a check valve 62. The filter 60 is used to filter the liquid photoresist 52. The purpose of the check valve 62 is a kind of one-way valve so as to prevent the liquid photoresist 52 from flowing back. The liquid photoresist 52 further passing through a sucking-back valve 64 then is transported to a duct end 72 and is, for example, sprayed onto a substrate(substrate) 56 that is held by a spinner 54. The sucking-back valve 64 is used to allow the liquid photoresist 52 to be sucked back a little from the duct end 72 when the photoresist coating process completes so that undesired extra liquid photoresist, such as a few drops, is prevented from dropping on the substrate 56, causing a deterioration of a photoresist layer (not shown) formed on the substrate 56.

A control part of the photoresist dispensing system further includes a solenoid valve 66, a first pump speed controller SC3, a second pump speed controller SC4, and a sucking-back speed controller 67. The control is driven by gas. The single line route 91 represents a gas duct. The pump 58 and the sucking-back valve 64 are controlled by a solenoid valve 66, which switches operation modes between a dispensing mode and a stopping mode. In the dispensing mode, the liquid photoresist 52 is transported to the duct end 72 to spray the substrate 56. In stopping mode, the liquid photoresist 52 is not dispensed but sucked back a little to prevent undesired photoresist from dropping out onto the substrate 56. The solenoid valve 56 includes an air-out end EXH to exhaust air and an air-in end AIR to engulf air so as to achieve the purpose of control.

The air-in end AIR is coupled to the first pump speed controller SC3 at an end 55. The first pump speed controller SC3 further includes an end 57 coupled to a first input/output (I/O) end 59 of the pump 58. The air-out end EXH is coupled to the second pump speed controller SC4 at an end 61. The second pump speed controller SC4 further includes an end 63 coupled to a second input/output (I/O) end 65 of the pump 58. In this coupling manner, the switching speed of the pump 58 from stop to action or from action to stop can be controlled by the solenoid valve 66.

Figure 1:
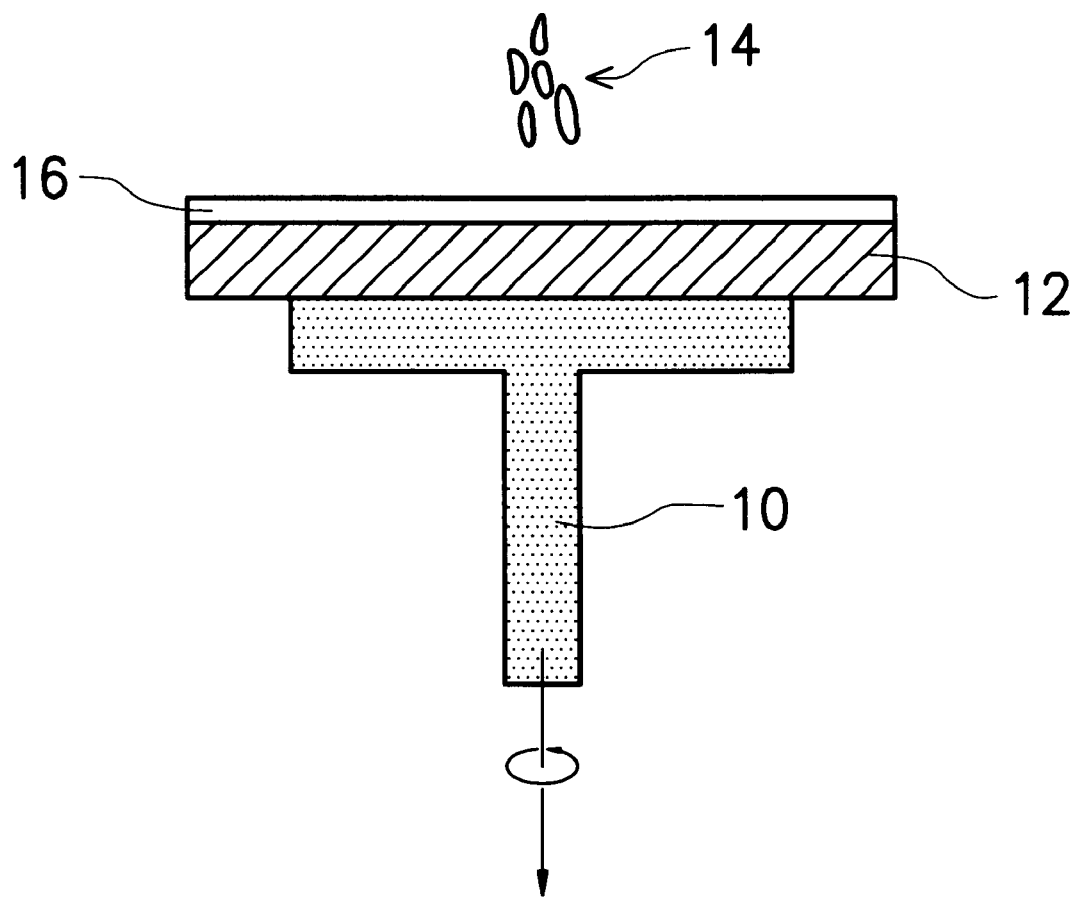
FIG. 1 is a side view of a conventional spinner used for spin coating.
Figure 2:
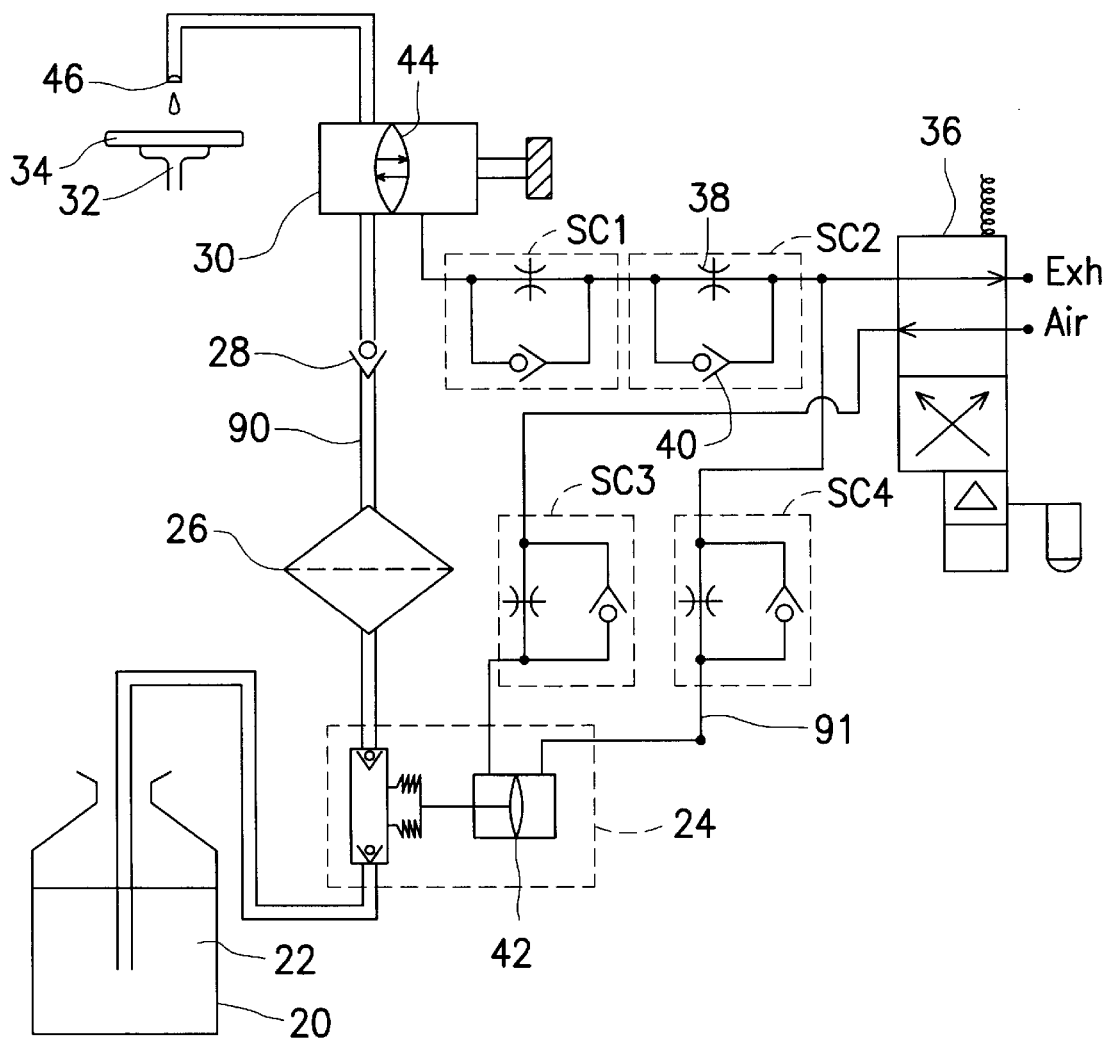
FIG. 2 is a schematic drawing of a conventional photoresist dispensing system included in a photoresist coating machine.

Moreover, the sucking-back speed controller 67 is coupled between a third I/O end 69 of the sucking-back valve 64 and the end 63 of the second pump speed controller SC4 so that the air-out EXH is also coupled to the sucking-back valve 64 through the sucking-back speed controller 67. In this coupling manner, the sucking-back valve 64 can be controlled by the solenoid valve 66. The sucking-back speed controller 67 further includes at least one speed controller, such as two serially coupled speed controllers SC1, SC2, which are like the first and the second pump speed controllers. The sucking-back valve 64 further includes a diaphragm 70, which can, for example, move forward or backward to produce a sucking force or release the sucking force. When the sucking force is created, the liquid photoresist 52 is sucked back form the duct end 72 to prevent undesired liquid photoresist from dropping onto the substrate 56 to deteriorate quality of the photoresist layer. The speed controllers SC1, SC2, SC3, and SC4 are similar to those used in FIG. 2.

In this coupling manner of the invention, the route from the air-out EXH to the sucking-back valve 64 has two more speed controllers SC1, SC2 than that of the route from the air-out EXH to the pump. A delay time of action on the sucking-back valve 64 is built up. This allows an control advantages as follows.

When the solenoid valve 66 switches the operation mode from a dispensing mode to a stopping mode, the combined effect of the air-in AIR and the air-out EXH controls the pump 58 to stop dispensing. The air-out EXH triggers the sucking-back valve 64 to produce a sucking force after a delay time due to the sucking-back speed controller 67. Therefore, the sucking-back valve 64 can suck the liquid photoresist 52 in time from the duct end 72 when dispensing stops. The sucking force is induced by pulling the diaphragm 70 to the right, referring to the relative direction of FIG. 3.

Similarly, when the operation mode is switched by the solenoid valve 66 from the sopping mode to the dispensing mode, the pump 58 is activated first, then after a certain delay time the sucking-back valve 64 releases sucking force by, for example, pushing the diaphragm 70 to the left, referring to relative direction of FIG. 3. Therefore, undesired liquid photoresist drops are effectively avoided to drop onto the substrate 56 before dispensing photoresist starts.

In conclusion, the improved photoresist dispensing system of the invention can avoid undesired photoresist to drop onto the substrate 56 by producing a delay time resulting form the sucking-back speed controller 67. When dispensing is stopping, the sucking-back valve 64 is activated in time after the pump 58 is stopped. When dispensing is starting, the sucking-back valve 64 releases sucking force in time after the pump 58 is activated.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A chemical solution dispensing system used to dispense a chemical solution onto a substrate, the system comprising:
    a pump, used to transport the chemical solution, wherein the pump comprises a first input/output (I/O) end and a second I/O end;
    a sucking-back valve, receiving the chemical solution from the pump and allowing the chemical solution to be dispensed onto the substrate, wherein the sucking-back valve comprises a third I/O end used to be triggered to produce or release a sucking force on the chemical solution;
    a solenoid valve, performing a switch function to control the pump and the sucking-back valve, wherein the solenoid comprises an input end and an output end;
    a first pump speed controller, coupled between the first I/O end of the pump and the input end, used to control the switching speed of the pump;
    a second pump speed controller, coupled between the second I/O end of the pump and the output end, used to control the switching speed of the pump; and
    a sucking-back speed controller, coupled between the third I/O end of the sucking-back valve and a route between the second I/O end of the pump and the second pump speed controller, used to control the switching speed of the sucking-back valve;
    wherein, during the solenoid valve switching on/off the pump for dispensing status of the chemical solution to the substrate, the sucking-back valve is triggered to release/produce its sucking force with a sufficient delay time resulting from the sucking-back speed controller.

2. The system of claim 1, wherein the chemical solution comprises photo-sensitive material.

3. The system of claim 1, wherein the chemical solution comprises liquid photoresist.

4. The system of claim 1, wherein the system used in a photoresist coating machine to for a photoresist layer on a substrate.

5. The system of claim 1, wherein the sucking-back speed controller comprises at least one speed control unit, which is used for a purpose of delaying action of the sucking-back valve.

6. The system of claim 5, wherein the sucking-back speed controller comprises two speed control units that are serially coupled.

7. The system of claim 1, wherein the solenoid valve control the pump and the sucking-back valve through an air flow resulting from the input end and the output end.

8. The system of claim 1, wherein the switching function of the solenoid valve behaves like a control to start dispensing or stop dispensing the chemical solution.

9. The system of claim 8, wherein during the control to start dispensing the chemical solution, the pump starts before the sucking-back valve releases it sucking force.

10. The system of claim 8, wherein during the control to stop dispensing the chemical solution, the sucking-back valve produce it sucking force after the pump stops.

11. The system of claim 1, wherein the sucking-back valve further comprises a diaphragm, which can be controlled to move forward or backward inside of the sucking-back valve to produce or release its sucking force.

12. The system of claim 11, wherein the diaphragm of the sucking-back valve is controlled through the third I/O end.

13. A chemical solution dispensing system used to dispense a chemical solution onto a substrate, the system comprising:
    a pump, used to transport the chemical solution, wherein the pump comprises a first input/output (I/O) end and a second I/O end;
    a filter, coupled to the pump to filter the chemical solution;
    an one-way valve, coupled to the filter to receive the chemical solution, and prevent the chemical solution from flowing backward;
    a sucking-back valve, receiving the chemical solution from the one-way valve and allowing the chemical solution to be dispensed onto the substrate, wherein the sucking-back valve comprises a third I/O end used to be triggered to produce or release a sucking force on the chemical solution;
    a solenoid valve, performing a switch function to control the pump and the sucking-back valve, wherein the solenoid comprises an air-in end and an air-out end;
    a first pump speed controller, coupled between the first I/O end of the pump and the air-in end, used to control the switching speed of the pump;
    a second pump speed controller, coupled between the second I/O end of the pump and the air-out end, used to control the switching speed of the pump; and
    a sucking-back speed controller, coupled between the third I/O end of the sucking-back valve and a route between the second I/O end of the pump and the second pump speed controller, used to control the switching speed of the sucking-back valve;
    wherein, during the solenoid valve switching on/off the pump for dispensing status of the chemical solution to the substrate, the sucking-back valve is triggered to release/produce its sucking force with a sufficient delay time resulting from the sucking-back speed controller.

14. The system of claim 13, wherein the chemical solution comprises liquid photoresist.

15. The system of claim 13, wherein the system used in a photoresist coating machine to for a photoresist layer on a substrate.

16. The system of claim 13, wherein the sucking-back speed controller comprises at least one speed control unit, which is used for a purpose of delaying action of the sucking-back valve.

17. The system of claim 16, wherein the sucking-back speed controller comprises two speed control units that are serially coupled.

18. The system of claim 13, wherein the solenoid valve control the pump and the sucking-back valve through an air flow resulting from the input end and the output end.

19. The system of claim 13, wherein the switching function of the solenoid valve behaves like a control to start dispensing or stop dispensing the chemical solution, in which during the control to start dispensing the chemical solution, the pump starts before the sucking-back valve releases it sucking force, and during the control to stop dispensing the chemical solution, the sucking-back valve produce it sucking force after the pump stops.

20. The system of claim 13, wherein the sucking-back valve further comprises a diaphragm, which can be controlled to move forward or backward inside of the sucking-back valve to produce or release its sucking force, in which the diaphragm of the sucking-back valve is controlled through the third I/O end.

* * * * *